United States Patent
Fabick et al.

(10) Patent No.: US 7,271,333 B2
(45) Date of Patent: Sep. 18, 2007

(54) APPARATUS AND METHOD OF PRODUCTION OF THIN FILM PHOTOVOLTAIC MODULES

(75) Inventors: Leon B. Fabick, Denver, CO (US); Alan W. Yehle, Lakewood, CO (US)

(73) Assignee: Ascent Solar Technologies, Inc., Littleton, CO (US)

( * ) Notice: Subject to any disclaimer, the term of this patent is extended or adjusted under 35 U.S.C. 154(b) by 514 days.

(21) Appl. No.: 10/197,813

(22) Filed: Jul. 19, 2002

(65) Prior Publication Data

US 2003/0127128 A1    Jul. 10, 2003

Related U.S. Application Data

(60) Provisional application No. 60/306,463, filed on Jul. 20, 2001.

(51) Int. Cl.
*H01L 31/00*    (2006.01)

(52) U.S. Cl. .............. 136/256; 136/244; 136/249; 136/262; 136/260; 136/261; 136/252; 136/255; 136/258; 257/431; 257/461; 257/443; 257/459; 257/55

(58) Field of Classification Search ........... 136/256, 136/244, 249, 262, 260, 261, 252, 255, 258; 257/431, 461, 443, 459, 55
See application file for complete search history.

(56) References Cited

U.S. PATENT DOCUMENTS

| | | | |
|---|---|---|---|
| 2,433,566 A | | 12/1947 | Lamb |
| 4,918,507 A | * | 4/1990 | Yoshida ............... 257/459 |
| 5,057,163 A | * | 10/1991 | Barnett et al. .......... 136/258 |
| 5,232,519 A | * | 8/1993 | Glatfelter et al. ........ 136/256 |
| 6,184,457 B1 | | 2/2001 | Tsuzuki et al. |

FOREIGN PATENT DOCUMENTS

JP      11-186572 A  *  7/1999

OTHER PUBLICATIONS

Fabick et al, "A New Thin-Film Space PV Module Technology," Conference Record of the 9th IEEE Photovoltaic Specialists Conference, pp. 971-973, May 19-24, 2002.*

* cited by examiner

*Primary Examiner*—Rodney G. McDonald
(74) *Attorney, Agent, or Firm*—Lathrop & Gage LC

(57) ABSTRACT

The present invention relates to light-weight thin-film photovoltaic cells, methods for making cells, modules made from cells, and methods for making modules from cells. The invention teaches a manner in which individual cells may be bonded to one another, eliminating the need for an additional support substrate and interconnecting leads, thus reducing the overall weight and thickness of individual cells and modules of the cells.

72 Claims, 9 Drawing Sheets

APPARATUS AND METHOD OF PRODUCTION OF THIN FILM PHOTOVOLTAIC MODULES

CROSS REFERENCE TO RELATED APPLICATIONS

The present application is related to and claims the benefit of, under 35 U.S.C. § 119(e), U.S. Provisional Patent Application Ser. No. 60/306,463, filed 20 Jul. 2001, which is expressly incorporated fully herein by reference.

BACKGROUND OF THE INVENTION

1. Field of the Invention

The present invention relates to light-weight thin-film photovoltaic cells, methods for making cells, modules made from cells, and methods for making modules from cells. The invention teaches a manner in which individual cells may be bonded to one another, eliminating the need for an additional support substrate and interconnecting leads, thus reducing the overall weight and thickness of individual cells and modules of cells.

2. Description of the Prior Art

The prior art method of producing thin-film photovoltaic cell devices includes bonding individual cells onto a load-bearing substrate sheet such as Kapton®. This load bearing substrate, together with the leads necessary to electrically connect individual cells, contributes to the overall weight of the device. This additional weight and thickness is particularly undesirable in space applications.

Currently, two barriers to implementing thin-film photovoltaic cell devices in space applications are difficulty obtaining large areas of photovoltaic material deposited on a light-weight substrate and difficulty forming light-weight space-survivable interconnects between individual cells in an array.

SUMMARY OF THE INVENTION

The present invention provides, for example, reduced weight solar cells, of particular importance in extraterrestrial applications, by providing a method of bonding individual cells to one another. The present invention also provides, for example, integrated interconnects which may also be easier and cheaper to manufacture.

It is an object of the present invention to provide a light-weight photovoltaic device and a method for its manufacture. This is accomplished by providing a non-fragile insulator layer supporting a weld or bonded contact. This non-fragile layer permits two or more of the light-weight photovoltaic devices to be connected without requiring an additional support layer. In addition, connecting the individual photovoltaic devices together further decreases the weight because it eliminates the needs for electrical leads between the individual cells. It is a further object of the present invention to provide a thin photovoltaic device and method for its manufacture. This is accomplished by eliminating the need for an additional support layer, by substituting non-fragile insulator for a portion of the photoactive layer. This insulator layer provides non-fragile support for weld or bonded contacts, allowing individual photovoltaic devices to be bonded to each other rather than requiring an additional support layer.

It is a further object of the invention to provide a method of producing thin-film solar arrays that may be much lighter per unit of power than existing single crystal solar cell arrays. Moreover it is an object of the present invention to further reduce the weight of solar arrays by reducing the structure required to support a thin-film blanket. Additionally, it is an object of the present invention to provide a solar array that may be contained with lower-weight hardware during launch.

In one embodiment of the present invention, a cell may be constructed beginning with a substrate. This substrate may, for example, be a rectangular plate. Preferably, the substrate may be a polygon which defines the shape of the photovoltaic cell, including a photoactive area and an electrical bus. The electrical bus may be a series of triangles connected at their bases by a narrow rectangle. Preferably the center of these triangular regions may be the location of weld or bond contacts. The substrate may, for example, be formed from stainless steel, titanium, tantalum, molybdenum, a polyimide (for example a polyimide such as Kapton®), or a iron-nickel-cobalt alloy such as Kovar®. The preferred material is stainless steel. A photoactive layer may be deposited on this substrate. This photoactive layer, may, for example, comprise a photovoltaic device. This photovoltaic device may preferably comprise a cadmium-indium-gallium-diselinide (CIGS) device. The photoactive layer may cover a portion of one side of the substrate. Preferably the layer should define a region, or a plurality of regions, for use as weld or bond contact points. In one embodiment of the present invention, the defined regions may include the triangular portions of the substrate, and corresponding areas on the opposite side and at the opposite end of the substrate. One method by which these regions may be defined is by applying the photoactive layer to a substantial portion of the substrate.

Next, the area where the photoactive layer is desired may be masked. This masking may, for example, be accomplished by means of low adhesion tape or metal contact mask. Next, an etching solution may be applied to the device to etch the unmasked areas down to the substrate. The etching solution may preferably be HCl followed by Br/MeOH. Following the etching process, the mask may be removed. Alternatively, the desired areas may be etched using, for example, electro-decomposition, laser ablation, or bead blasting.

Another way to define the shape of the photoactive layer is to place physical contact masks over the desired areas prior to deposition of the photoactive layer; however, other photolithographic techniques are not precluded. Additionally, if the photoactive layer is grown by applying precursor layers, these precursor layers may be applied to define the desired areas.

The photoactive layer may, for example, alternatively comprise amorphous silicon, cadmium telluride, or thin-film silicon. The photoactive layer may be applied, for example, by thermal evaporation, sputtering, or electron-beam evaporation.

Next, a layer of insulator may be applied to the substrate. The insulator layer may preferably be applied to the areas of the substrate on the same side as the photoactive layer that are not covered by the photoactive layer, including, for example, areas from which portions of the photoactive layer have been etched. The insulator may, for example, comprise silicon dioxide, aluminum nitride, alumina, silicon nitride, or adhesive bonding agents. The preferred material is silicon dioxide, or an adhesive bonding material. The insulator may preferably be applied by plasma enhanced chemical vapor deposition. The insulator may also be applied, for example, by sputtering.

Next, a grid may be applied to the photovoltaic device and first insulator layer. This grid may preferably comprise a conductor. This conductor may preferably comprise a metal, preferably aluminum or silver. Other metals or conductors are not precluded, however, it is preferable that the material for the grid have a low sheet resistance. The grid may preferably truncate in a bus. This bus may, for example, comprise an area covering the triangular-shaped region of the insulator layer. The shape of the bus, and consequently the shape chosen for the underlying substrate, is not required to be triangular. A triangular shape, however, will provide good electrical characteristics without providing as much weight as, for example, a completely rectangular-shaped bus. Other shapes are not precluded. The grid may preferably be applied by electron-beam deposition. Other techniques for applying the grid include, for example, thermal evaporation and screen printing.

Finally, weld contacts may be applied to the weld contact points. The weld contact points may preferably be located in the triangular areas of the bus, and in corresponding locations at the opposite end, and reverse side of the cell. The weld contacts may comprise a conductor. Preferably, this conductor comprises a metal, such as, for example, silver. It is valuable for the weld contact to be formed of a material that has good ductility at low temperature. It is of additional value, in certain applications, for the material to resist work hardening after thermal cycling. The weld contacts may preferably be applied by electro-deposition. Other available techniques, for example, include thermal evaporation and sputtering.

Additionally, if desired, a second layer of insulator may be added to the top and bottom surfaces of the cell, exclusive of the weld contacts or weld contact points. This insulator layer may have the beneficial result of reducing the operating temperature of the cell by increasing the emissivity and decreasing the absorptivity of the device.

Furthermore, an electro-static discharge layer may be added to each side of the device. If no insulator layer has been added to a side of the device, other layers, including, for example, the photoactive layer and the substrate layer, may perform the function of an electro-static discharge layer. Moreover, if, for example, an electrostatic discharge layer is completely covered by an insulator layer, its function as an electro-static discharge layer may not be optimal. The electro-static discharge layer may preferably be applied to substantially the same area of the cell as the second layer of insulator. The electro-static discharge layer may, for example, comprise indium tin oxide, tin oxide, cadmium tin oxide, or zinc oxide. Some techniques for applying the electro-static discharge layer include, for example, sputtering, electron-beam evaporation, and thermal evaporation. The preferred technique is sputtering, but other techniques are not precluded. The addition of an electro-static discharge layer is not required, but may be desirable if the cell will be used in a high plasma environment. The layer may have the beneficial effect of bleeding off charge, thus avoiding sparking and consequent damage to the cell.

These above described steps may provide an individual cell. Modules of these cells may be formed by, for example, bonding two or more individual cells together. The bonding may, for example, comprise bonding the weld contacts of one side of one cell to the weld contacts of one side of another cell. The sides may be alternated, providing a shingling effect. This may have the desirable effect of shadowing only the bus, and not the photoactive portions of the cell. The bonding may preferably comprise spot welding.

Other techniques may, for example, include soldering or brazing. The bonding may, for example, be accomplished by spot welding, or by any other standard metal-to-metal bonding technique, such as brazing, soldering, and additional forms of welding. Although one pair of weld contacts will permit the bonding of multiple individual cells, it may be preferable to use three or more pairs to ensure that the strength of the module is not compromised if one of the weld contacts fails.

Alternatively, the strength of the module may be enhanced by the addition of one or mechanical bonds (for example, adhesive bonds) between a pair of cells in the module. This bond may be provided directly between the cells or may be provided through one or more apertures in a spacer. The spacer may, for example, include a rectangular sheet of polyimide. The sheet of polyimide may be adapted to allow the electrical bond or bonds and the mechanical bond or bonds to pass through it. The mechanical bonds may be chosen to be an insulating material. If a spacer is used, it may be advantageous to supply it with slits adapted to relieve mechanical stresses placed on it. A further alternative is to supply a single mechanical bond that occupies a significant area. This mechanical bond may contain an embedded insulating mesh, insulating scrim, or insulating beads.

It is understood that both the foregoing general description and the following detailed description are exemplary and explanatory only and are not restrictive of the invention as claimed. The accompanying drawings illustrate several embodiments of the invention and together with the description serve to explain the principles of the invention.

DETAILED DESCRIPTION OF THE PREFERRED EMBODIMENTS

Figure 1:
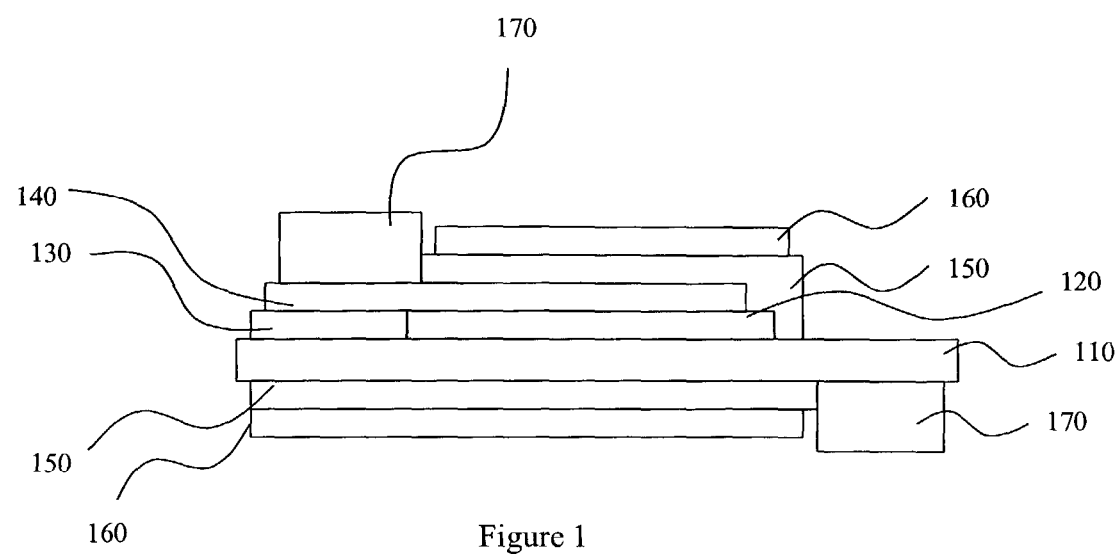
FIG. 1 is a diagram of a cross section of a preferred embodiment of the present invention.

It is to be understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "a layer" is a reference to one or more layers and includes equivalents thereof known to those skilled in the art, unless otherwise necessarily dictated by the context of the description. For example, the photoactive layer may comprise a plurality of layers, including layers that are not, in themselves, photoactive, such as, for example a transparent conductive oxide layer or a substrate layer. Moreover, the application of one layer to another is sometimes referred to herein by the term deposition. This term is meant to include non-traditional depository methods of joining two layers, including, for example, but not limited to ceramic-ceramic bonding of two existing layers. Additionally, while three pairs of weld contacts for each cell may have the beneficial result of providing redundant resistance to twisting, the number of pairs of weld contacts is only an example.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. All references cited herein are incorporated by reference herein in their entirety.

In one embodiment of the present invention, a photovoltaic device is provided on a light-weight substrate. The device and substrate may be generally planar and may be referred to as a sheet or panel. The photovoltaic device may, for example, be a copper-indium-gallium-selenide (CIGS) photovoltaic device. The substrate may be, for example, an approximately 0.001 in. thick substrate, and may be stainless steel. In this embodiment, a grid is then deposited on one side of the sheet (the face of the sheet). The grid may include several layers. For example, it may include a strike layer, a conductive layer, and a protective layer. Frequently, although one layer is herein described as the conductive layer, all of the layers may be conductive. The strike layer may, for example, comprise a 500 Angstrom layer of Titanium. The conductive layer may comprise, for example, a 2 micron layer of silver. The protective layer may, for example, comprise a 500 Angstrom layer of Nickel. A thermal coating may be applied to the device including the grid. This thermal layer may comprise, for example, $SiO_2$. This coating may be deposited by means of a plasma enhanced chemical vapor deposition process. The thickness of this coating may be about 5 microns. Thermal coating may also be applied over a layer of silver on the side of the sheet opposite the grid (the reverse of the sheet). An electrostatic discharge (ESD) layer may be applied over the thermal coating. The ESD layer may include indium tin oxide and may be approximately 600 Angstroms thick. The ESD layer may be connected to one or more of the electrical contacts. Preferably the portion of the ESD layer on the same side as the grid may be connected to the electrical contacts on that side of the sheet, and the portion of the ESD layer on the reverse of the sheet may be connected to the electrical contacts on that side of the sheet. This connection may provide the advantage of allowing charge to enter the circuit passing through the cell.

FIG. 1 depicts a preferred embodiment of an apparatus of the present invention. The apparatus, for use as a photovoltaic cell, comprises at its core a layer of substrate (110). This substrate (110) may preferably comprise stainless steel. The substrate (110) may also or alternatively include other materials such as, for example, titanium, tantalum, Kovar.RTM., molybdenum, polyimide, and Kapton.RTM.

On the substrate (110) a layer of photoactive material (120) may be deposited. The photoactive layer (120) may comprise a photovoltaic device, such as, for example, a copper-indium-gallium-diselinide (CIGS) device. The photoactive layer (120) may also or alternatively include other materials such as, for example, amorphous silicon, cadmium telluride, and thin-film silicon. The photoactive layer (120) may be deposited, for example, by thermal evaporation, sputtering, or electron-beam evaporation. The shape of the photoactive layer (120) may be defined by removing a portion of the applied layer, by laser etching, chemical etching, or bead blasting material from the substrate (110) or by other techniques including, for example, photolithography, placing a physical contact mask on the substrate (110) during the deposition of the photoactive layer (120), by patterning precursors to the photoactive layer (120) to define the desired shape, or by laser etching the material from the substrate.

On a portion of the remaining exposed upper surface of the substrate (110) a first layer of insulator (130) may be deposited. This first layer of insulator (130) may preferably comprise silicon dioxide. The first layer of insulator (130) may also or alternatively comprise other materials including, for example, aluminum nitride, alumina, silicon nitride, or bonded polyimide. The first layer of insulator (130) may preferably be deposited by plasma enhanced chemical vapor deposition. Other techniques, such as, for example, sputtering, are not precluded.

On the first layer of insulator (130), and on the photoactive layer (120), a grid (140) may be deposited. The grid (140) may preferably comprise a bus. The bus may, preferably, cover the first layer of insulator (130). The grid (140) may comprise a conductor, preferably a metal, most preferably aluminum or silver. Other conductors which preferably exhibit low sheet resistance may also be suitable. The grid (140) may, for example, be deposited by electron-beam deposition. Other techniques that may be used include, for example, thermal evaporation, sputtering, and screen printing.

If desired, on the grid (140) and on the bottom of the substrate (110), a second layer of insulator (150) may be deposited. The second layer of insulator (150) preferably may provide clearance for the weld contacts (170). This second layer of insulator (150), if deposited, may have the beneficial result of increasing emissivity, and lowering absorptivity, thus reducing the operating temperature of the device.

Additionally, if desired, an electrostatic discharge layer (160) may be deposited on (or in place of) the second layer of insulator (150), although in the absence of the second layer of insulator (150), the grid (140), the photoactive layer (120), and the substrate (110) may provide the function of an electro-static discharge layer (160). The electro-static discharge layer (160) may, for example, comprise indium tin oxide, tin oxide, cadmium tin oxide, or zinc oxide. A beneficial result may accrue from the deposition of the electro-static discharge layer (160), namely that the layer (160) may bleed off charge, preventing sparking and consequent damage to the device.

Finally, one may deposit weld contacts (170) to each side of the cell. These weld contacts (170) may comprise silver. Other conductors, and in particular, other metals, are not precluded; however, silver is the preferred material because it is ductile at low temperatures and will not work harden while undergoing thermal cycling. The weld contacts (170)

may be preferably applied by electron-deposition. Other techniques, such as, for example, thermal evaporation and sputtering are not precluded.

Figure 2A:
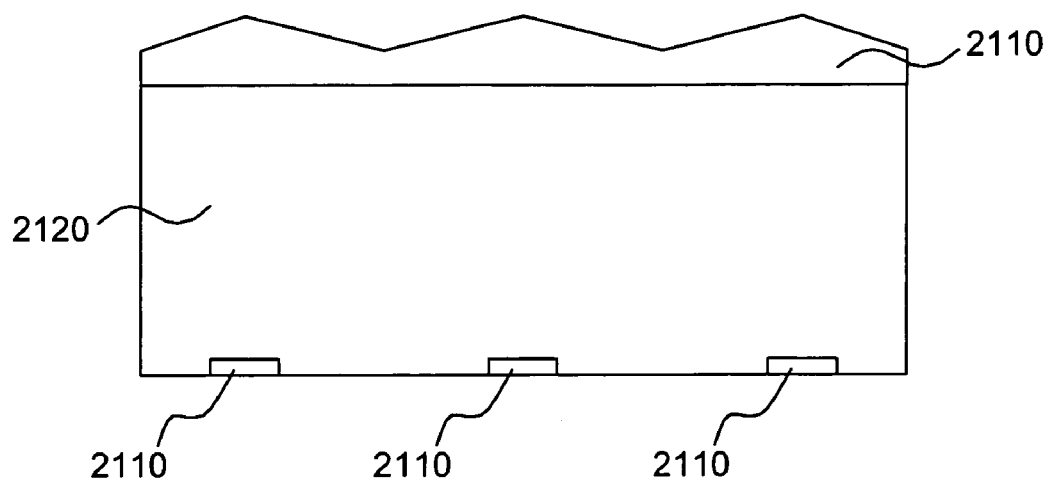
FIG. 2a is a top view diagram of a section of a preferred embodiment of the present invention.
Figure 2B:
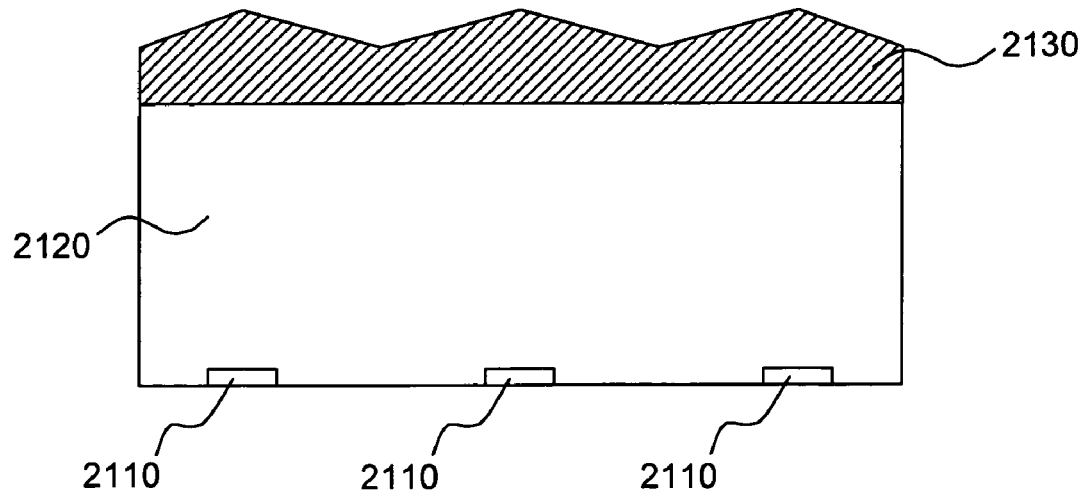
FIG. 2b is a top view diagram of the section of FIG. 2a, with a first insulator layer.
Figure 2C:
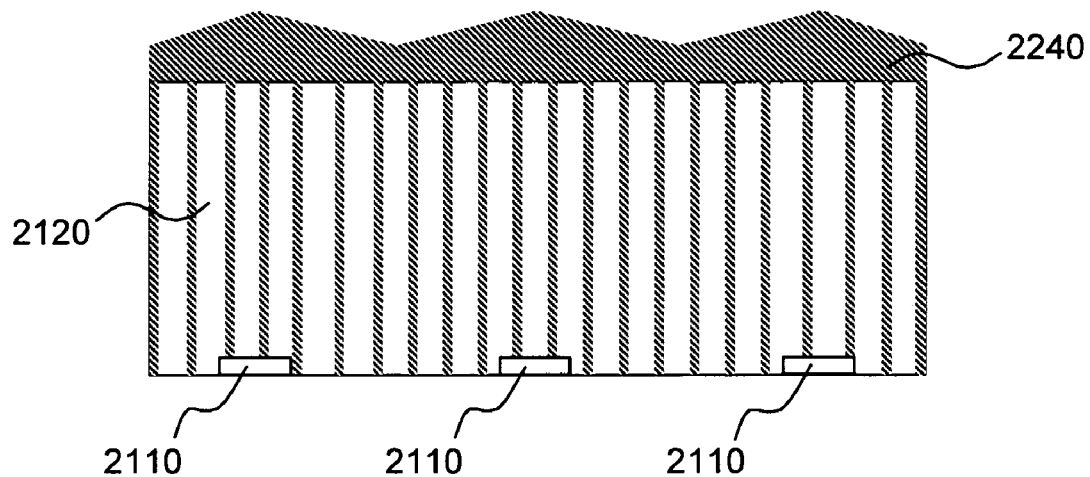
FIG. 2c is a top view diagram of the section of FIG. 2b after deposition of a grid.
Figure 2D:
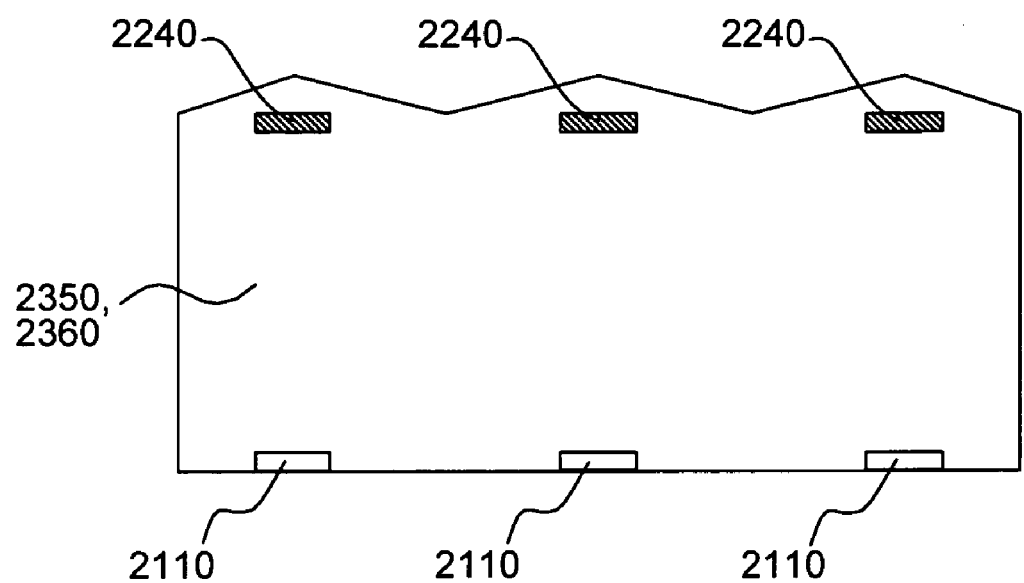
FIG. 2d is a top view diagram of the section of FIG. 2c after deposition of another insulator layer and/or an electro-static discharge layer.
Figure 2E:
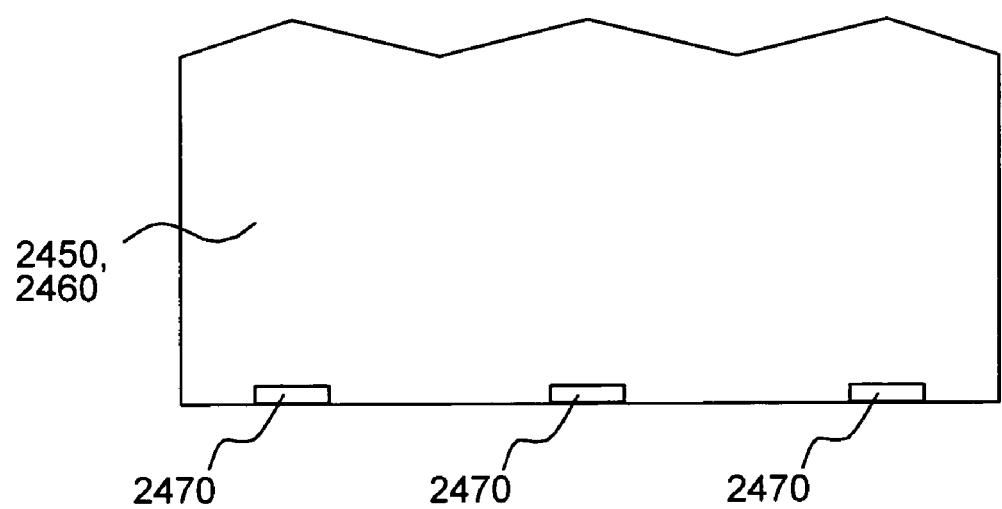
FIG. 2e is a bottom view diagram of a preferred embodiment of the present invention.

FIGS. 2a, 2b, 2c, 2d and 2e depict various stages in the manufacture of a preferred embodiment of the present invention, FIG. 2a depicts the substrate (2110) and photoactive layers (2120). The photoactive layer (2120) may be deposited as shown, or may be deposited more extensively and etched back to what is shown. FIG. 2b depicts the device after the deposition of first insulator layer (2130). First insulator layer (2130) for example covers areas of the exposed substrate (2110). FIG. 2c depicts the device after the deposition of the grid (2240). The photoactive layer (2120) may be partially or incompletely covered by the grid (2240). If the grid (2240) comprises an opaque material (opaque in the frequency range used by the photoactive layer (2120)), the grid (2240) should not completely cover the photoactive layer (2120). Additionally, the area that grid (2240) covers (including gaps between grid lines) should preferably partially or incompletely correspond to the photoactive layer (2120). The grid (2240) at the top may completely cover a layer of insulator under, for example, a triangularly shaped bus. A portion of the substrate (2110) may remain exposed. FIG. 2d shows the device after the deposition of the insulator (2350) and/or electrostatic discharge layer (2360). A portion of the grid (2240) may remain exposed, as may a portion of the substrate (2110). These exposed areas (2110, 2240) may provide clearance for the deposition of weld contacts. The weld contacts on the top surface of the device may preferably be located on the exposed grid (2240). FIG. 2e depicts the bottom of the device. The insulator layer (2350) and/or an electrostatic layer (2360) may be applied to cover substantially the entire surface of the device. These layers (2350, 2360) may define weld contact points (2470) corresponding to the exposed areas on the top surface of the device. The weld contact points (2470) may serve as the area of deposition of the weld contacts.

Figure 3:
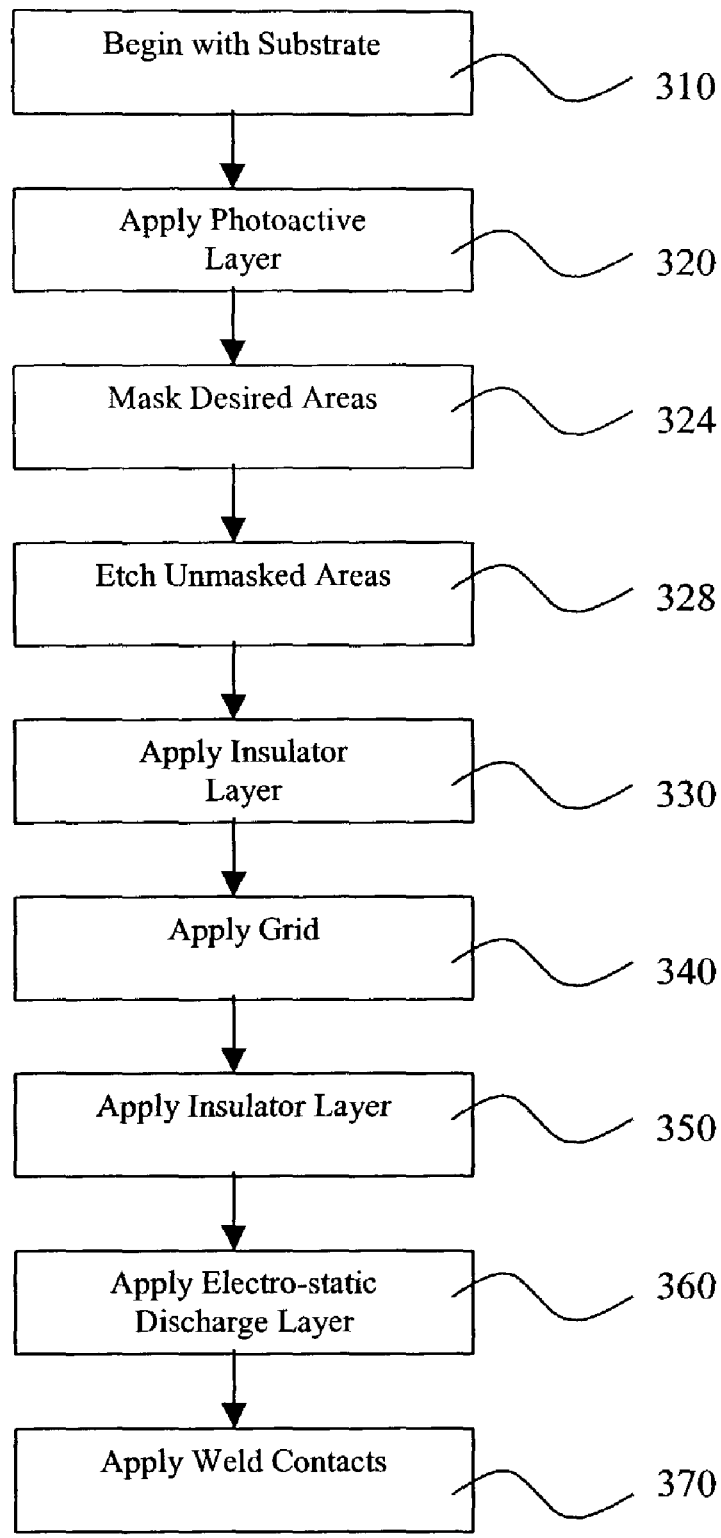
FIG. 3 is a conceptual flow diagram of a preferred embodiment of the present invention.

FIG. 3 portrays a conceptual flow diagram of a preferred embodiment of the present invention. One may begin by providing a substrate (310) comprising, for example, stainless steel. Other materials for use as a substrate include, for example, titanium, tantalum, Kovar®, molybdenum, polyimide, and Kapton®. One may deposit a photoactive layer (320) on the substrate. This photoactive layer may comprise a photovoltaic device, such as, for example, a copper-indium-gallium-diselinide device. Other materials for use as a photoactive layer include, for example, amorphous silicon, cadmium telluride, and thin-film silicon. The deposition of this layer may be accomplished, for example, by thermal evaporating, sputtering, or electron-beam deposition.

Next, the shape of the photoactive layer may be defined by, for example, etching. This may be accomplished by masking the areas on which one does not desire to etch (324) and etching the remaining unmasked areas (328). This masking (324) may be accomplished by, for example, the application of low adhesion tape. The etching may, for example, be accomplished by applying a solution of HCl followed by a solution of Br/MeOH. Alternatively, the etching may be performed by laser ablation or bead blasting.

When the photoactive layer is defined, a layer of insulator may be deposited on a portion of the exposed substrate (330). The insulator may comprise, for example, silicon dioxide. Other materials which may be used as an insulator include, for example, aluminum nitride, alumina, and silicon nitride. The insulator may for example, be deposited by plasma enhanced chemical vapor deposition, or by other techniques, such as, for example, sputtering.

Next, a grid may be deposited on the insulator and photoactive layers (340). This grid may comprise a bus which covers a substantial portion of the insulator layer. The grid may comprise aluminum, silver, or any other conductor. The use of aluminum or silver in the grid may be particularly beneficial because of their low sheet resistances.

Next, if desired, a second layer of insulator may be added covering most of the device (350). The second layer of insulator should, preferably, provide clearance for the weld contacts. The second layer of insulator may also provide the beneficial result of increasing emissivity and lowering absorptivity, thus lowering the operating temperature of the device.

Additionally, if desired, an electro-static discharge layer (360) may be added. This layer may, for example, comprise indium tin oxide, tin oxide, cadmium tin oxide, or zinc oxide. The adding of this electro-static discharge layer may be accomplished by, for example, sputtering, or by other techniques, such as, for example, thermal evaporation or electron-beam evaporation.

Finally, one may deposit weld contacts (370) to each side of the cell. The weld contacts may, for example, comprise silver. Other materials are not precluded, however, silver's ability to withstand work hardening in temperature cycling environments, together with its ductility at low temperature make it a preferred material. The weld contacts may, for example, be deposited by electron-deposition. Other techniques which may be used include, for example, thermal evaporation and sputtering.

Figure 4:
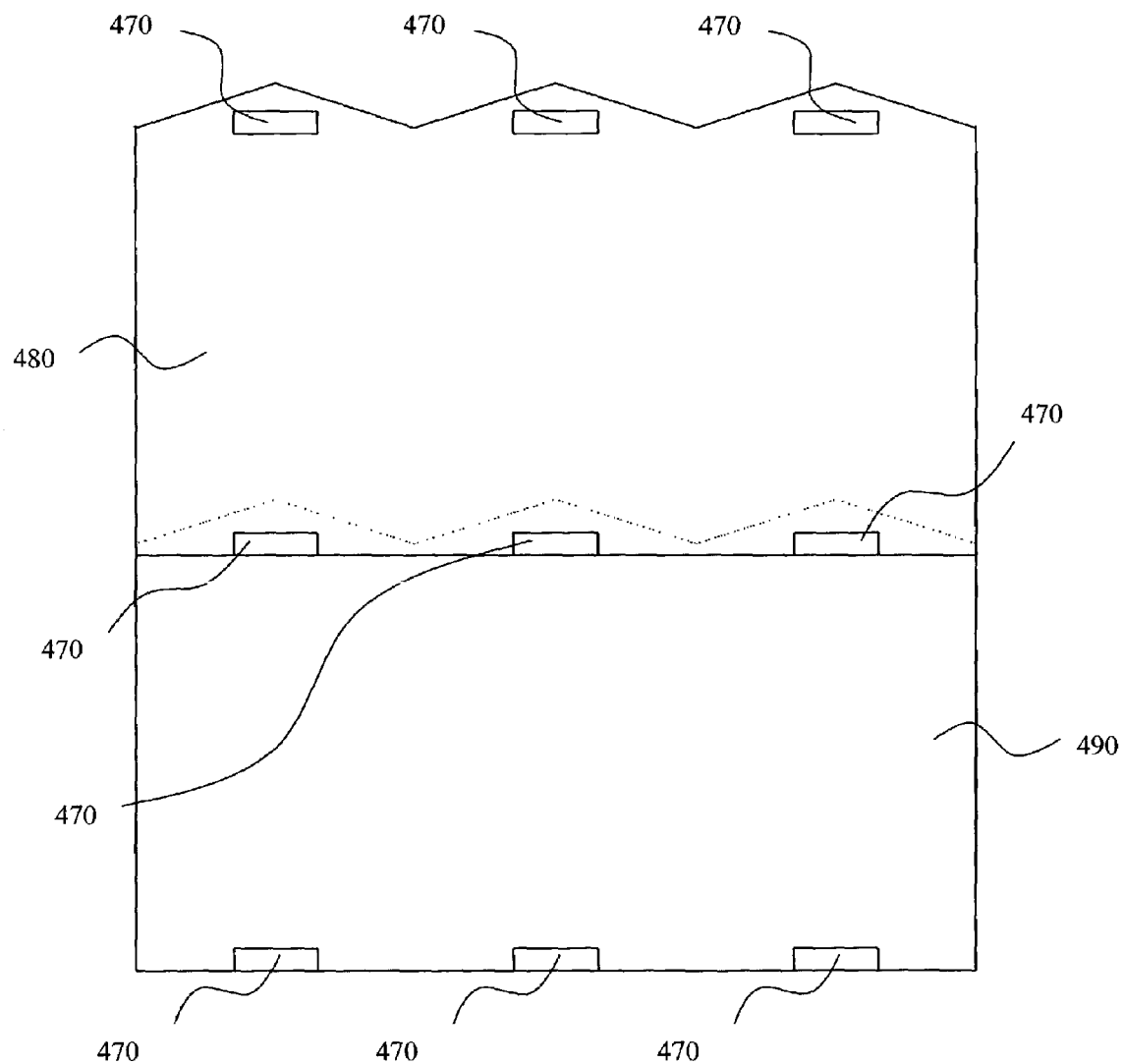
FIG. 4 is a top view partial look-through diagram of a preferred embodiment of the present invention.

FIG. 4 is a top view partial look-through diagram of a preferred embodiment of the present invention. A first photovoltaic cell (480) is connected to a second photovoltaic cell (490) by means of the weld contacts (470). This connecting may, for example, be performed by spot welding. Other techniques may also be used for connecting photovoltaic cells, including, for example, soldering and brazing. The dotted line depicts the hidden outline of the second cell (480).

Figure 5:
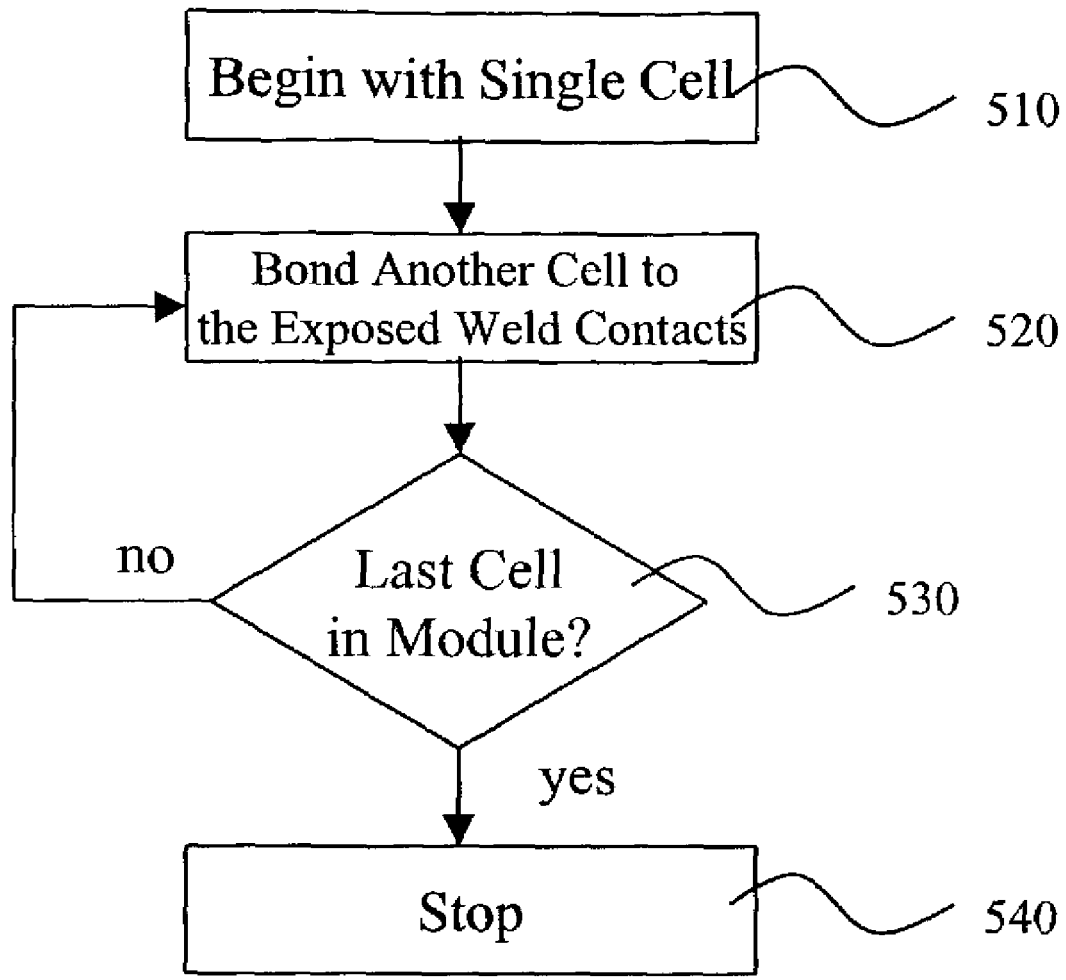
FIG. 5 is a conceptual flow diagram of a preferred embodiment of the present invention.

FIG. 5 is a conceptual flow diagram of a preferred embodiment of the present invention. One may begin with a first photovoltaic cell (510). Next, a second photovoltaic cell (520) may be attached to the first photovoltaic cell (510). This attaching may, for example, be accomplished by spot welding, or may comprise other techniques such as, for example, soldering, brazing, or adhesive bonding. The cells may be attached so that the bus of the second cell is shadowed by the first cell. If this is the last cell in the desired module (530), then the process is complete (540), otherwise, one may repeat the step of adding a cell (520) until complete (540).

Figure 6:
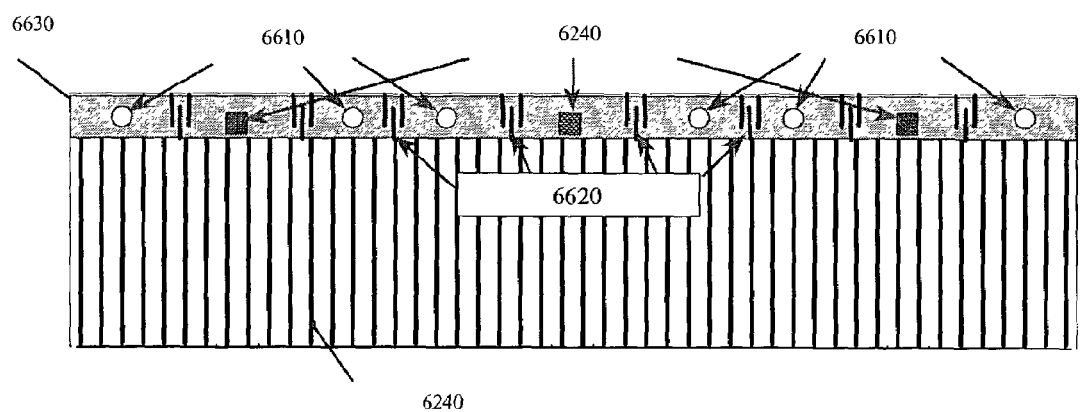
FIG. 6 is a diagram of an embodiment of the present invention employing additional mechanical connections.

FIG. 6 is a diagram of an embodiment of the present invention employing additional mechanical connections. This embodiment may have the advantage of reducing the mechanical reliance of the apparatus on the electrical bond 6240 between the photovoltaic device layers and a molybdenum layer. In some instances, an $MoSe_2$ layer may form at the junction between the photovoltaic device and a molybdenum layer. An $MoSe_2$ layer may possess a highly layered structure.

As depicted in the embodiment shown in FIG. 6, a polyimide spacer 6630 may be applied on top of the area of the substrate that is not photoactive. In this embodiment, a spacer 6630 may be adapted in several ways. First, several circular apertures may be provided to permit the introduction of mechanical bonds 6610 through the spacer 6630.

Next, several square apertures may be provided to permit electrical connections 6240 through the spacer 6630. The shapes of these apertures are exemplary only. There is no need to use the particular shapes described. Finally, several sets of narrow rectangular slits 6620 may be provided. These slits 6620 relieve mechanical stress placed on the polyimide spacer 6630 by such forces as thermal compression and expansion, and may prevent the fracture, loss, or separation of polyimide spacer 6630. If, as shown, the mechanical bonds connect the top of a first substrate with the bottom of an overlapping substrate, it may be desirable to use an insulating material in the mechanical bonds. It may also be desirable to minimize the size of each mechanical bond's area. This may be accomplished, in part, by increasing the number of mechanical bonds while decreasing the area of each mechanical bond. A reduced area for each mechanical bond may provide greater survivability at temperature extremes. It may be advantageous (based on considerations of structural integrity) to minimize the size of the electrical bonds 6240, while maintaining at least a minimum area to prevent the introduction of significant electrical resistance.

Alternatively, in an embodiment not depicted, a large mechanical bond may substitute for the spacer 6630 and small mechanical bonds 6610. The large mechanical bond may include bonding material intermixed with a glass scrim, glass beads, or other insulating material. This added material may improve the ability of the bond to maintain insulating properties after the stresses of thermal cycling.

Other embodiments of the invention will be apparent to those skilled in the art from consideration of the specification and the practice of the invention disclosed herein. It is intended that the specification and examples be considered as exemplary only, with a true scope and spirit of the invention being indicated by the following claims.

What is claimed is:

1. An apparatus for use as a thin-film photovoltaic cell comprising:
   a substrate having a first side and a second side;
   a photoactive layer deposited onto at least part of said first side of said substrate;
   a first insulator layer deposited onto at least part of said first side of said substrate;
   three or more weld contact points defined by said photoactive layer on said first side, said substrate exposed at the weld contact points;
   a grid deposited on said photoactive layer and on said first insulator layer, such that the substrate remains exposed at said weld contact points;
   a second insulator layer deposited on at least a portion of said grid and on said second side of said substrate such that the substrate remains exposed opposite said weld contact points; and
   at least one first weld contact deposited onto said grid covering said first insulator layer;
   wherein said first weld contact facilitates attachment to a second cell.

2. The apparatus of claim 1 wherein said substrate comprises a conductor.

3. The apparatus of claim 1 wherein said substrate comprises a material selected from the group consisting of: a metal, stainless steel titanium, tantalum, molybdenum, polyimide, and iron-nickel-cobalt alloy.

4. The apparatus of claim 1 wherein said photoactive layer comprises a photovoltaic device.

5. The apparatus of claim 4 wherein said photovoltaic device comprises a material selected from the group consisting of: a cadmium-indium-galium-diselinide device, amorphous silicon, cadmium telluride, and thin-film silicon.

6. The apparatus of claim 4 wherein said photovoltaic device is deposited on said first side of said substrate by thermal evaporation.

7. The apparatus of claim 4 wherein said photovoltaic device is deposited on said first side of said substrate by sputtering.

8. The apparatus of claim 4 wherein said photovoltaic device is deposited on said first side of said substrate by electron beam evaporation.

9. The apparatus of claim 1 wherein said first insulator layer comprises a material selected from the group consisting of: silicon dioxide, aluminum nitride, alumina, silicon nitride, and bonded polyimide.

10. The apparatus of claim 1 wherein said first insulator layer is deposited on said first side of said substrate by a technique selected from the group consisting of chemical vapor deposition, plasma enhanced chemical vapor deposition, and sputtering.

11. The apparatus of claim 1 wherein said grid comprises a conductor.

12. The apparatus of claim 1 wherein said grid comprises a metal.

13. The apparatus of claim 1 wherein said grid comprises aluminum.

14. The apparatus of claim 13 wherein said grid further comprises silver.

15. The apparatus of claim 13 wherein said grid further comprises titanium.

16. The apparatus of claim 13 wherein said grid further comprises multiple layers.

17. The apparatus of claim 13 wherein said grid further comprises a strike layer, a conductive layer, and a protective layer.

18. The apparatus of claim 17 wherein said strike layer comprises titanium.

19. The apparatus of claim 17 wherein said strike layer comprises a thickness of about 500 Angstroms.

20. The apparatus of claim 17 wherein said conductive layer comprises silver.

21. The apparatus of claim 17 wherein said conductive layer comprises a thickness of about 2 microns.

22. The apparatus of claim 17 wherein said protective layer comprises nickel.

23. The apparatus of claim 17 wherein said protective layer comprises a thickness of about 500 angstroms.

24. The apparatus of claim 1 wherein said grid is deposited on said first insulator layer and on said photoactive layer by electron beam deposition.

25. The apparatus of claim 1 wherein said grid is deposited on said first insulator layer and on said photoactive layer by thermal evaporation.

26. The apparatus of claim 1 wherein said grid is deposited on said first insulator layer and on said photoactive layer by sputtering.

27. The apparatus of claim 1 wherein said grid further comprises a bus.

28. The apparatus of claim 27 wherein said bus is triangular in shape.

29. The apparatus of claim 1, further comprising at least one second weld contact deposited on said second side of said substrate, underlying said weld contact points.

30. The apparatus of claim 29 wherein said first and second weld contacts comprise conductors.

31. The apparatus of claim 29 wherein said first and second weld contacts comprise metals.

32. The apparatus of claim 29 wherein said first and second weld contacts comprise silver.

33. The apparatus of claim 29 wherein said first and second weld contacts are deposited on said cell by a technique selected from the group consisting of electro-deposition and e-beam evaporation.

34. The apparatus of claim 29 wherein said first and second weld contacts are deposited on said cell by thermal evaporation.

35. The apparatus of claim 29 wherein said first and second weld contacts are deposited on said cell by sputtering.

36. The apparatus of claim 1, further comprising an electro-static discharge layer deposited on at least a portion of said second insulator layer.

37. The apparatus of claim 36 wherein said electro-static discharge layer is deposited on said grid and on said second side of said substrate by sputtering.

38. The apparatus of claim 36 wherein said electro-static discharge layer is deposited on said grid and on said second side of said substrate by thermal evaporation.

39. The apparatus of claim 36 wherein said electro-static discharge layer is deposited on said grid and on said second side of said substrate by electron beam evaporation.

40. The apparatus of claim 36 wherein said electro-static discharge layer comprises a material selected from the group consisting of: indium tin oxide, tin oxide, cadmium tin oxide, and zinc oxide.

41. The apparatus of claim 36 wherein said electro-static discharge layer is deposited on said second insulator layer by sputtering.

42. The apparatus of claim 36 wherein said electro-static discharge layer is deposited on said second insulator layer by thermal evaporation.

43. The apparatus of claim 36 wherein said electro-static discharge layer is deposited on said second insulator layer by electron beam evaporation.

44. The apparatus of claim 1 wherein said weld contact points are produced by the steps of masking a potion of said photoactive layer; etching an unmasked portion of said photoactive layer; removing said unmasked portion of said photoactive layer; and exposing a portion of said substrate, and wherein said grid is deposited such that said substrate remains exposed at said weld contact points.

45. The apparatus of claim 44 wherein said masking step comprises a technique selected from the group consisting of applying a low adhesion tape and applying a physical contact mask.

46. The apparatus of claim 44 wherein said etching step comprises applying a solution of HCl.

47. The apparatus of claim 44 wherein said etching step comprises applying a solution of Br/MeOH.

48. The apparatus of claim 1 wherein said weld contact points are produced by applying electro-decomposition to a portion of the photoactive layer.

49. The apparatus of claim 1 wherein said weld contact points are produced by applying a physical contact mask defining said weld contact points prior to applying said photoactive layer, and removing said physical contact mask after applying said photoactive layer.

50. The apparatus of claim 1 wherein said weld contact points are produced by applying said photoactive layer, so as to define said weld contact point.

51. The apparatus of claim 1 further comprising providing a spacer on a portion of said substrate.

52. The apparatus of claim 51 wherein said spacer comprises polyimide.

53. The apparatus of claim 51 wherein said spacer is adapted to allow one or more mechanical bonds through said spacer.

54. The apparatus of claim 51 wherein said spacer is adapted to allow one or more electrical bonds through said spacer.

55. The apparatus of claim 51 wherein said spacer is provided with one or more stress relief cut-outs.

56. The apparatus of claim 1 further comprising a mechanical bond connected to a portion of said substrate.

57. The apparatus of claim 56 wherein said mechanical bond comprises insulating material.

58. The apparatus of claim 56 further comprising an embedded material in said mechanical bond.

59. The apparatus of claim 58 wherein said embedded material comprises one or more of a material selected from the group consisting of a glass scrim, glass beads, and an insulating mesh.

60. The apparatus of claim 1 wherein said photoactive layer comprises a material that is adapted to be used in a solar cell.

61. The apparatus of claim 1, wherein said apparatus is survivable in a space environment and operable to convert incident solar energy to electrical energy.

62. The apparatus of claim 1, wherein said grid comprises a first weld contact and said weld contact points comprise a second weld contact.

63. An apparatus for use as a module of photovoltaic cells comprising:
  a first apparatus comprising a substrate having a first side and a second side;
    a photoactive layer deposited onto at least part of said first side of said substrate;
    a first insulator layer deposited onto at least part of said first side of said substrate;
    three or more weld contact points defined by said photoactive layer and said first insulator layer on said first side, said substrate exposed at said weld contact points;
    a grid deposited on said photoactive layer and on said first insulator layer, such that the substrate remains exposed at said weld contact points;
    a second insulator layer deposited on at least a portion of said grid and on said second side of said substrate such that the substrate remains exposed opposite said weld contact points;
    at least one weld contact deposited onto said grid covering said first insulator layer;
  a second apparatus comprising a substrate having a first side and a second side;
    a photoactive layer deposited onto at least part of said first side of said substrate;
    a first insulator layer deposited onto at least part of said first side of said substrate;
    three or more weld contact points defined by said photoactive layer and said first insulator layer on said first side, said substrate exposed at said weld contact points;
    a grid deposited on said photoactive layer and on said first insulator layer, such that the substrate remains exposed at said weld contact points;
    a second insulator layer deposited on at least a portion of said grid and on said second side of said substrate such that the substrate remains exposed opposite said weld contact points; and
    at least one weld contact deposited onto said grid covering said first insulator layer;

wherein said second apparatus is attached to said first apparatus.

64. The apparatus of claim 63 wherein said first and second apparatus are attached by metal-metal bonding.

65. The apparatus of claim 63 wherein said first and second apparatus are attached by spot welding.

66. The apparatus of claim 63 wherein said first and second apparatus are attached by soldering.

67. The apparatus of claim 63 wherein said first and second apparatus are attached by brazing.

68. The apparatus of claim 63 wherein a portion of said first apparatus overlaps said second apparatus.

69. The apparatus of claim 63 wherein said first and second apparatus are attached at said weld contact points of said first apparatus and said at least one weld contact of said second apparatus.

70. The apparatus of claim 69, further comprising a weld contact on said second side of said first apparatus, wherein the weld contact on said second side of said first apparatus is connected to said weld contact on said first side of said second apparatus.

71. The apparatus of claim 70, further comprising a plurality of weld contacts on said second side of said first apparatus, wherein the plurality of weld contacts on said second side of said first apparatus are connected to a plurality of weld contacts inclusive of said at least one weld contact on said first side of said second apparatus.

72. An apparatus for use as a module of photovoltaic cells comprising the apparatus of claim 63, and an apparatus comprising a substrate having a first side and a second side; a photoactive layer deposited on said first side of said substrate; a first insulator layer deposited on said first side of said substrate; a grid deposited on said photoactive layer and on said first insulator layer; a first weld contact deposited on said grid covering said first insulator layer; and a second weld contact deposited on said second side of said substrate, attached to said apparatus of claim 63.

* * * * *